(12) United States Patent
de Rochemont

(10) Patent No.: US 6,553,646 B1
(45) Date of Patent: Apr. 29, 2003

(54) METHOD FOR ENCLOSING A CERAMIC FILAMENT

(75) Inventor: L. Pierre de Rochemont, Dover, NH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 160 days.

(21) Appl. No.: 09/750,615

(22) Filed: Dec. 21, 2000

Related U.S. Application Data

(63) Continuation-in-part of application No. 09/122,711, filed on Jul. 27, 1998, which is a continuation-in-part of application No. 08/422,211, filed on Apr. 14, 1995.

(51) Int. Cl.[7] ............................................... H01L 39/24
(52) U.S. Cl. ....................................... 29/599; 228/248.1
(58) Field of Search ........................... 29/599, DIG. 48; 228/148, 144, 156, 248.1; 505/230, 430

(56) References Cited

U.S. PATENT DOCUMENTS 5,686,394 A  *  11/1997  Sibata et al. ................... 29/599

FOREIGN PATENT DOCUMENTS

JP            49-14979      *   4/1974  ............... 228/248.1

* cited by examiner

*Primary Examiner*—David P. Bryant
(74) *Attorney, Agent, or Firm*—Thomas C. Stover

(57) ABSTRACT

In the present invention, a superconducting (sc) ceramic filament is enclosed in a silver sheath which is sealed therearound by applying silver powder between the surfaces of said sheath, pressing the surfaces and powder into contact and then applying sufficient heat to fuse them together, which heat is below the melting point of the surfaces and powder and then sintering the so enclosed ceramic filament, which upon cooling, forms a superconductor.

13 Claims, 15 Drawing Sheets

METHOD FOR ENCLOSING A CERAMIC FILAMENT

CROSS-REFERENCE TO RELATED PATENT APPLICATIONS

This application is a continuation-in-part of co-pending application, Ser. No. 09/122,711 filed on Jul. 27, 1998, itself a continuation-in-part of co-pending parent application U.S. Ser. No. 08/422,211 filed Apr. 14, 1995.

STATEMENT REGARDING FEDERALLY SPONSORED RESEARCH OR DEVELOPMENT

The invention described herein may be manufactured and used by or for the Government for governmental purposes without the payment of any royalty thereon.

FIELD OF THE INVENTION

This invention relates to a method for enclosing a ceramic filament, particularly enclosing same in a metallic sheath.

BACKGROUND OF THE INVENTION

The present invention relates to metal composite wire or sheet structures containing low-temperature (low-$T_c$) or high-temperature (high-$T_c$) superconducting ($HTS_c$) ceramic oxides. In these structures, the superconductor is applied as a deposit, within a metal composite matrix with or without additional metallic, metal alloy, or ceramic filamentary components. The present invention relates, in particular, to the design, process fabrication and construction of HTSc-metal composite wires or sheets of finite or indefinite continuous length, in which the HTSc ceramic is embedded within or deposited on a metallic sheet that is used in the final composite structure. The superconducting ceramic is used either as a single filament (superconducting layer), or as multiple filaments, or as either in association with other metallic or ceramic filamentary components that provide greater mechanical, thermal or electrical stability to the function of the composite structure. Furthermore, each filamentary component containing HTSc ceramic is imparted a predetermined c-axis orientation relative to the longitudinal or radial axis of the wire, or planar axis of the sheet. Application of this c-axis textured ceramic sheet allows the designer to improve the electromagnetic performance characteristics of the composite structure.

Superconductors conduct electromagnetic power without resistive loss when cooled below an intrinsic thermodynamic transition temperature, commonly defined as the $T_c$ of the material. In addition to allowing the resistanceless transport of electromagnetic power, the superconductive state also nulls electric fields and expells magnetic flux (lines of force) from within the interior of the material. This combination of properties allows superconductors to be useful in a variety of electromagnetic systems that require electromagnetic power storage, power delivery, power regulation, low loss power transmission, power amplification, or electromagnetic shielding.

Electromagnetic power can be stored within a superconducting wire or sheet when it is wound or formed into a topological surface representative of a magnetic coil or solenoid. Power is supplied to the superconductor by driving an electrical current through it from an external source. This generates an electrical supercurrent within the superconductor. This is known as charging the superconductor. When the superconductor is sufficiently charged, a superconducting short circuit is activated between the ends of the coil structure, so the electrical supercurrents circulating within the coil may follow a closed loop continuous superconductive path. Since the superconducting path does not dissipate the electrical power, the supercurrents persist indefinitely. After the superconducting storage device as been charged, the stored power can be tapped to supply power to an electrical grid.

This same configuration can be used to regulate power to the grid when active electrical switches and relays that monitor the grid are configured to tap the electrical power in the superconductor when the grid is experiencing an electrical energy surplus. Since the superconductor is an extremely low loss electrical power conduit, cables, bus bars, or leads, can also be used to transmit power from an electrical energy source to the load with negligible power loss, or power loss that is significantly less than that of normally resistive power feeds. Since the superconductor has no dc electrical resistivity, it can be used to transfer electrical power in a cryogenic environment with negligible heat generation.

Radio frequency (rf) electrical power is amplified by a cavity resonator. The physical dimensions and dielectric constants of the materials used to construct the cavity determine the frequencies that will maximally experience power amplification within the resonator. Quality-factors (Q-factors) characterize the gain per unit frequency within the resonator structure. Q-factors can be greatly enhanced, allowing significant improvements to rf gain over a narrower band of rf frequencies. If the walls of the cavity structure are coated with a layer of superconducting material.

Since the superconducting state thermodynamically prevents electric and magnetic fields from penetrating its interior, a hollow superconducting surface enclosing field sensitive instrumentation can shield these devices from harmful external electromagnetic radiations. Likewise, if a magnetic field source or electromagnetic radiation source is placed within a hollow superconducting shell, the superconducting surface can be used to confine or constrain field emissions or to shape magnetic field emissions protruding out a hole in the superconducting shell.

These embodiments of superconducting topologies are useful in a variety of electrical systems that require the efficient utilization of the available power budget, such as an airborne or space-based system. They are also useful in devices that require the efficient manipulation, generation, or delivery of powerful electromagnetic pulses, for instances in electromagnetic weaponry or electromagnetic rail guns; or, the regulation, storage and transmission of electric power over an electrical grid; or, the amplification of an rf power source, for instance in electric countermeasure devices or radar systems; or to protect sensitive electronic equipment against electronic countermeasures or interfering radiation.

All of these applications require the superconducting material to be cooled to a temperature below its thermodynamic transition temperature. If the material is heated above its $T_c$ it will fail to operate as a superconductor and revert back to its state of normal resistance, causing the unique functionality of the material to be lost to the application. The application of magnetic fields and electrical currents to the superconductor can also stress the thermodynamic state of superconductivity. If the superconductor is maintained at the lowest possible temperature and no electrical currents are passing through it, a threshold magnetic field can be applied above which magnetic flux is no longer expelled from the material and it fails to remain superconducting. The value of magnetic field that causes the superconducting state to rupture is defined as the critical magnetic field ($H_c$). If the temperature of the superconductor is increased to a value that is elevated but still below its $T_c$ the intensity of an applied magnetic field that will rupture the superconducting state is less than the $H_c$ measured at the lowest possible temperature The intensity of magnetic field that is needed to rupture the superconductor is an increasing function of decreasing temperature below $T_c$ of the superconductor. This relationship can also be interpreted as meaning the $T_c$ of the superconductor is a decreasing function of increasing applied magnetic field intensity.

The physical representation of this relationship can be mapped onto a graph using temperature and magnetic field intensity as axes, with a line defining the boundary between superconducting and normally resistive states of the material. This line is referred to as the irreversibility line of the superconductor. All values of field and temperature that are within this line (closer to the origin of the axes) allow the material to retain its superconductive properties. All values of field and temperature that are exterior to this line (further from the origin of the axes) rupture the superconductive state of the material.

A similar functionality is observed with electrical current traveling through the superconductor. At the lowest possible temperature, and in the absence of an applied or generated magnetic field intensity, the superconductor will be able to transport a maximal level of electrical current density. If the current density is increased beyond this maximal level, known as the critical current density ($J_c$) of the superconductor, the superconductive state is ruptured. As is the case with applied magnetic field intensity, the $J_c$ decreases with increasing temperature below $T_c$. It can alternatively be stated that the $T_c$ of the superconductor decreases with increasing current load.

Superconductivity was initially discovered in certain pure metals (such as mercury, lead, vanadium, niobium and tin) that are cooled to very low temperatures, generally less than 4 K. These superconductors, known as type-I superconductors, expell all magnetic flux from their bulk interiors until a critical magnetic field intensity is applied. The critical magnetic field intensities, critical current densities, and critical temperatures of these superconducting pure metals are so low that utilizing the phenomenon of superconductivity with them has limited practical value.

It was subsequently discovered that certain impure metals and metallic alloys, like niobium-tin or niobium-germanium, also exhibit superconductivity at elevated temperatures and higher magnetic field intensities. What distinguishes these superconductors from the type-I superconductors is that the superconducting state still persists even though some of the applied magnetic flux actually penetrates their interior without rupturing the superconducting state. The penetrating flux is confined to tubular clusters known as fluxoids. In normally resistive material all of the lines of applied magnetic flux are uniformly distributed throughout the material. In this mixed state of a superconductor the penetrating flux lines are packed into discrete tubular flux clusters. Equal groupings of flux lines are channeled into the fluxoids, causing the flux line density to increase within the fluxoid and be zero between fluxoids. Inside the volume of the fluxoid the superconductor is in a state of normal electrical resistance, while outside the microscopic volume of the fluxoid it retains its superconducting properties.

Under stable conditions of thermodynamic equilibrium, these bundles of magnetic flux distribute themselves with uniform cluster densities over the superconducting surface and maintain their equilibrium positions. A larger fraction of the superconductor's volume remains superconducting if fewer fluxoids penetrate the superconductor. Fluxoid penetration increases with increasing superconductor temperature below $T_c$. Superconductors that exhibit this "mixed state" are known as type-II superconductors. These materials have greater practical use since they retain their superconducting properties at higher temperatures than type-I superconductors, and at magnetic field intensities common to many practical application.

Superconductivity has also been observed in certain ceramic materials, such as barium-potassium bismuthate ($Ba_xK_{1-x}BiO_3$) and a variety of copper-oxide ceramics, including yttrium-barium-copper oxide ($YBa_2CU_3O$), and specific material phases of certain bismuth cuprate (Bi—Pb—Sr—Ca—Cu—O), thallium cuprate (Tl—Ba—Ca—Cu—O), and mercury cuprate (Hg—Ba—Ca—Cu—O), ceramics. The cuprate superconductors exhibit type-II superconductivity at significantly higher superconducting transition temperatures (90–140 K), and are referred to as high-$T_c$ superconductors. The bismuthate ceramic is an isotropic low-$T_c$ superconductor.

It is thus defined that the superconducting state is a function of the material, its temperature, the current density flowing through it, and the magnetic field intensity applied to it. In order for a superconductor to be applied in any of the applications mentioned above, the environment in which it is operating must be designed to maintain thermodynamic conditions that prevent the material from transitioning from the superconducting state into its state of normal electrical resistance. The ability to maintain control over the thermodynamic state of the superconductor can be improved by enveloping the superconductor as a single, or as multiple, filamentary strands(s) within a metal composite matrix. The specific metals or metallic alloys, as well as their relative physical dimension, used in this composite structure are selected on the basis of their intrinsic physical properties and the ability of these properties to relieve or mitigate the occurrence and propagation of energetic disturbances or instabilities that develop within the superconductor as it is operated.

Energetic disturbances that can compromise the performance of active superconductors are known to have either a mechanical origin or be the result of magnetic flux jumping. Mechanical disturbances could be due to the gradual or catastrophic release of physical stresses that develop as a result of electromagnetic loading on the mechanical component(s) of the superconductor, or due to transient or steady state vibrations that develop within the superconductor as electrical current passes through it. Magnetic flux jumping describes the sudden and dissipative rearrangement of magnetic flux within a superconductor. It is predominantly generated by the repulsive electromagnetic interaction of the penetrating lines of magnetic flux with electrical currents transported through the superconductor. Magnetic flux oriented perpendicular to the path of moving electrical charge is subject to an electromagnetic force, known as the Lorentz force, $F_L$.

In isotropic superconductors, the magnitude of the Lorentz force on a single bundle of penetrating magnetic flux is:

$$F_L = \partial \Phi_o \sin \Theta. \qquad (1)$$

where $\partial$ is the current flow per unit area passing by the flux bundle, $\Phi_o$ is the magnetic flux density contained within the bundle, and ⊖ is the angle subtended between the direction of the current flow and the orientation of the magnetic flux bundle. The effect of this force on the electrical current causes it to be deflected from its original path. The effect of this force on stable penetrating flux bundles causes them to be dislodged from their equilibrium positions. The acquired kinetic energy of the moving fluxoids is eventually dissipated within the superconductor as heat.

Often these energetic disturbances occur at specific points within the superconducting structure. If the energetic point disturbance is sufficiently long lived, the accumulated thermal energy dissipated by the disturbance may be sufficient to locally trigger the superconducting state to revert back to its state of normal resistance at that point. Current passing through this normally resistive point will start generating greater quantities of heat, which, if not quickly transported to a thermal reservoir, can precipitate catastrophic failure along the entire length of the conductor. An objective for embedding the superconductor within a metal composite structure is to provide thermally conductive pathways that drain the dissipated heat at rates faster than the energetic disturbance can generate it in the superconductor. Superconducting metal composite structures are also useful because the metal provides a low resistivity electrical pathway to shunt current in the superconductor if it goes normal. Filamentary components can also be selected to improve the mechanical integrity of the composite through strength membering, or to dampen unwanted vibrational modes, thus relieving the incidence of mechanical energetic disturbances.

The selection of metallic components interfaced with the superconductor must also be compatible with its material processing requirements. The sintering kinetics of high-$T_c$ superconducting ceramics require that the ceramic precursor be hermetically encased in a silver sheath if they are to be efficiently processed into the more desirable superconducting phases. Silver has very high rates of oxygen diffusivity at elevated temperatures. Exposing the ceramic to controlled oxygen atmospheres is needed to regulate the thermal reaction kinetics while processing the precursors into the desired phase of the sintered ceramic. Some components of high-$T_c$ superconducting ceramics can become volatile in oxygen partial pressure atmospheres that are favorable to the reaction when elevated to the necessary process temperatures. The hermetic silver barrier blocks evaporative or liquid loss of the more unstable precursor components while still permitting use of optimal oxygen atmospheres to favorably regulate the chemical kinetics of the sintering reaction.

Composite wire structures of high-$T_c$ superconducting ceramics are currently manufactured by billet processing techniques. In billet processing, a stoichiometric blend of precursor powder, referred to as the billet, is packed into a silver tube which is hermetically sealed at both ends. The billet can either be a blend of elemental metallic precursors, elemental metal oxide precursors, or powders of distinct microstructural phases of the ceramic that are known to react favorably or efficiently into the desired single phase of the ceramic during subsequent processing. Depending upon which billet process is used, this tubular composite structure can then be mechanically deformed and elongated into a monocore wire and reacted to form the superconducting phase, or pre-reacted and drawn into monocore wire structures before the final thermal sintering of the superconductor.

Existing billet-processing techniques allow precursor powders to be deformed into monocore (single filament) wires. Multifilamentary wire structures produced using this technique are fabricated by fusing multiple monocore powder-in-tube structures into a large bundle, and drawing the entire composite through a die to reduce its overall diameter and to extend its length before reacting the formed wire. In both cases, the superconductor is in intimate contact and fully enveloped by the silver casing.

Often it is desirable to have metals other than silver in intimate contact with the superconductor to reinforce its thermal or mechanical performance. The selection of what metallic composition would be usefully applied in intimate contact with the superconductor depends upon whether or not it would be more useful to improve the thermal or mechanical performance of the superconductor in the application for which the composite structure is intended. Since precursors powders are necessarily packed into a sealed tube, billet processing techniques only allow silver, or metals with comparable oxygen diffusivities at temperatures used to process the superconductor, to have intimate contact with the superconductor. The composite structures made using these metals and this technique may not allow the superconductor to achieve optimal performance standards within the composite.

Billet processing techniques have other practical drawbacks. While they can be used to synthesize long lengths of wire, it is not a processing technology that is well suited for many of the application listed above. For instance, high-$T_c$ superconducting electrical power transmission between a power station and a substation will require extremely long continuous lengths of superconductor. Billet processing only permits the fabrication of composite structures of finite length determined by the initial dimensions of the tube into which the billet is packed and the extent to which it is deformed. Other possible applications, such as electromagnetic shielding or superconducting rf cavity resonators may require large continuous sheets of high-$T_c$ superconducting ceramic, or exposed ceramic surfaces that cannot be made using billet processing.

Another approach to improving the performance of the superconducting composite structure is to implement design structures that reduce the incidence of magnetic flux jumping in the superconductor. Flux jumping can be hindered by introducing microscopic defects that act as flux pinning centers. Fluxoid bundles are immobilized at these centers, and consequently will not dissipate kinetic energy into the superconductor provided the flux pinning potential of the center is greater than the energies the fluxoids are experiencing through Lorentz force interactions with currents in the superconductor. In multiple element superconductors, i.e., not pure metals, flux jumping can be reduced by fabricating the superconductor using a materials synthesis process that achieves fine subdivision of the individual precursors. Powder synthesis techniques do not allow extremely fine precursor subdivision.

A more fundamental problem to billet processing is its inability to implement innovative composite design architectures that reduce magnetic flux jumping in the high-$T_c$ superconducting ceramics. When the billet is packed into the silver tube, the crystallographic orientation of the precursor powders are randomly oriented with respect to one another. The final ceramic reaction product is c-axis textured by thermomechanically sinter processing—(heating and flattening)—the entire composite structure. Consequently, as a result of this thermomechanical sintering step, the finished phase in the ceramic filament(s) is produced with its c-axis oriented uniquely in one direction.

A fundamental property of the high-$T_c$ superconducting ceramics is their crystallographic anisotropy. The crystalloqraphic structure of these ceramics is characterized by the crystallographic c-axis, the long axis of its crystalline unit cell, which is perpendicular to the basal or a-b-crystallographic plane. Superconductivity in the high-$T_c$ cuprates is exhibited primarily along the basal plane of the ceramic. Superconductive phenomena, as measured by critical current densities and critical field intensities, is considerably weaker in these ceramics along orientations parallel to the crystallographic c-axis. This is particularly true at elevated temperature and in applied magnetic fields. Consequently, these ceramics are more susceptible to flux jumping in magnetic fields that are oriented parallel to the ceramic c-axis than they are to magnetic fields oriented along their basal plane.

This anisotropy is less exagerated at low temperatures, i.e., near 4 K, but becomes increasingly and dramatically pronounced at temperatures above 10–15 K. Therefore, despite the high superconducting (onset) transition temperatures for these ceramics (90–127 K), this fundamental property can severely limit their practical application unless superconducting surfaces and multifilamentary composites can be constructed with predetermined c-axis topologies that favorably orient the ceramic to the anticipated magnetic field lines of a given application. Depending upon the application, this will require some ceramic filaments in the structure to have their c-axis oriented in directions that are different from others. This cannot be achieved using billet processed composites in which c-axis texturing is achieved, if it all, during the final sintering step, usually causing all of the ceramic filaments to have similar c-axis orientation if they are thermomechanically processed.

Thus, there exist a need for a more effective manufacturing process to construct high-$T_c$ superconducting multifilamentary composite structures. The improved manufacturing process should allow superconducting ceramic components to have predetermined c-axis orientation within the composite structure, as well as provide a means to place the superconducting components in intimate contact with filamentary metals or metal alloys other than silver without sacrificing an oxygen diffusion pathway to the exterior of the composite structure during atmosphere-controlled thermal processing. This manufacturing process should also allow other ceramic filamentary components, which have electrically resistive or magnetorestrictive properties that are favorable to the stable function of the composite, to be incorporated with similar ease. Finally, this manufacturing process should also allow composite structures to be fabricated to indefinite continuous lengths or surface areas.

SUMMARY OF THE INVENTION

The present invention provides a manufacturing process to construct a multifilamentary composite structure using superconducting ceramic, or other ceramic components, that have been imparted predetermined c-axis orientation, and the ability to manufacture such structures with indefinite continuous length or surface area. This invention is particularly useful to the manufacture of composite structures containing high-$T_c$ superconducting ceramic filamentary components, which are known to have poorer resistance to magnetic flux jumping if applied or generated magnetic fields are oriented parallel to their crystallographic c-axis, particularly at temperatures above 10–15 K.

This capability can allow the construction of high-$T_c$ superconducting metal composite architectures designed to function at higher operating temperatures than what is currently capable in composite structures constructed using more conventional synthesis methods. It further allows specific architectural designs to be implemented for specific superconducting applications.

This process uses a technique that easily achieves ultrafine subdivision of the precursor elements that are reacted to form the superconducting material, thereby improving the magnetic flux jumping characteristics to which it can be made.

Therefore, one object of the present invention is the method used to fabricate (deposit and construct) a superconducting metal composite structure in which the superconducting filament(s) have been imparted pre-determined c-axis orientation.

Another object of the invention is to implement innovative design architectures that favorably orient the c-axis of the superconducting filament(s) to the anticipated magnetic field lines of the application in which the composite structure is intended to be used.

Another object of the invention is the utilization of the process to implement innovative design architectures that incorporate c-axis textured ceramic filament(s) with magnetostrictive, electrically insulating, or piezoelectric properties to stabilize the function of the superconducting filaments in the composite.

Another object of the invention is its ability to easily add to the composite other metallic or metal alloy filamentary components in intimate contact with the superconducting filaments to improve the thermal or mechanical characteristics of the composite structure.

Another object of the invention is the method to manufacture complex ceramic materials, that is, materials that have three or more elemental precursor components, to higher quality than can be achieved using billet or powder processing techniques.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENTS

Figure 1:
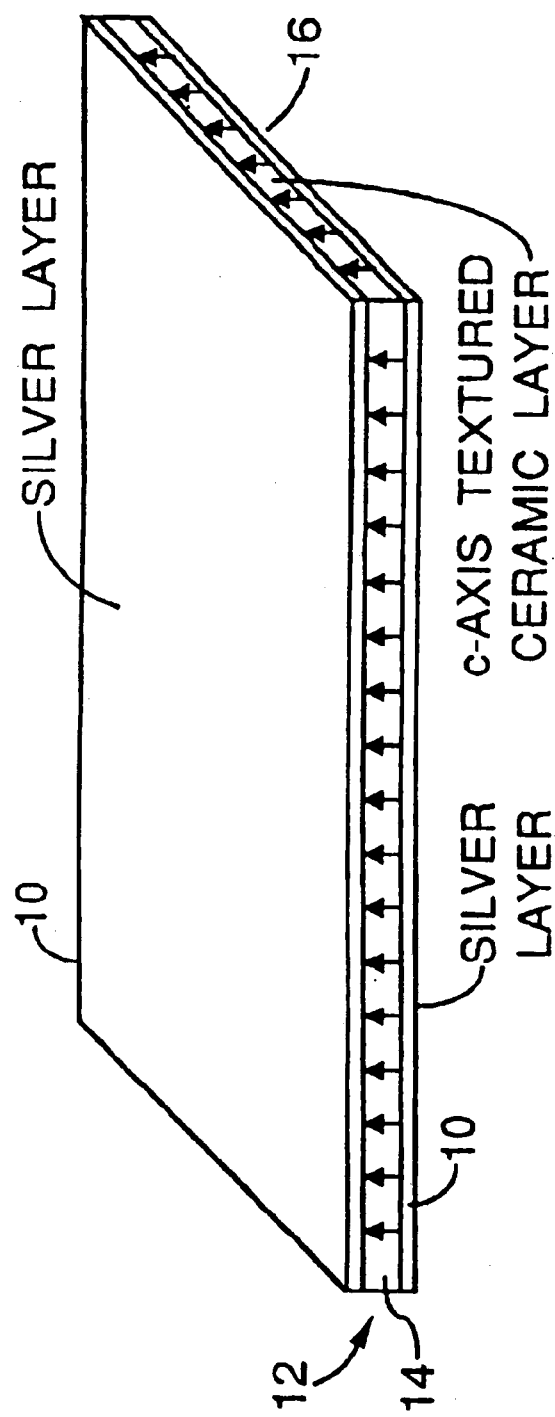
FIG. 1. Sheet of c-axis textured ceramic metal composite.

This invention permits ceramic superconducting materials to be spray deposited onto indefinitely large sheets of metallic substrate from a carboxylic acid salt solution. Elemental metal precursors of the superconductor are introduced into the solution as carboxylic acid salts. The deposit 14 formed on the malleable metallic substrate 10, FIG. 1, is then thermomechanically calcined to form c-axis textured metal-superconductor composite sheet structure 12. These composite sheet structures 12 can be formed by pressing together two ceramic-metal substrate composite structures, 10 and 14, ceramic face-to-face, to form a metal-ceramic-metal sheet structure, or by overlaying another metal sheet over the deposited structure 10, 14 and 10. Once the structure 12 has been thermomechanically calcined, the c-axis 16 of the principal microstructural phases of the superconductor is oriented parallel to the vector defining the plane of the metal sheet, i.e., perpendicular to the surface of the plane. These sheets of c-axis textured superconductor can then be cut to prespecified dimension and mechanically worked as continuous superconducting filaments 18, FIG. 14, into larger composite structures with predetermined c-axis orientation. The ceramic filament(s) with the composite will maintain this c-axis orientation after it (they) is (are) sintered into the final reaction product, i.e., the single ceramic phase ultimately desired in the composite.

Superconductors are compositional states of matter that lose all electrical resistance when they are cooled to temperatures below an intrinsic thermodynamic transition temperature, commonly defined as the $T_c$ of the material. In addition to allowing the resistanceless transport of electromagnetic power, the superconductive state also limits the penetration of electric and magnetic fields into their bulk interiors. This phenomenology makes them extremely useful for a variety of technological applications.

Figure 2:
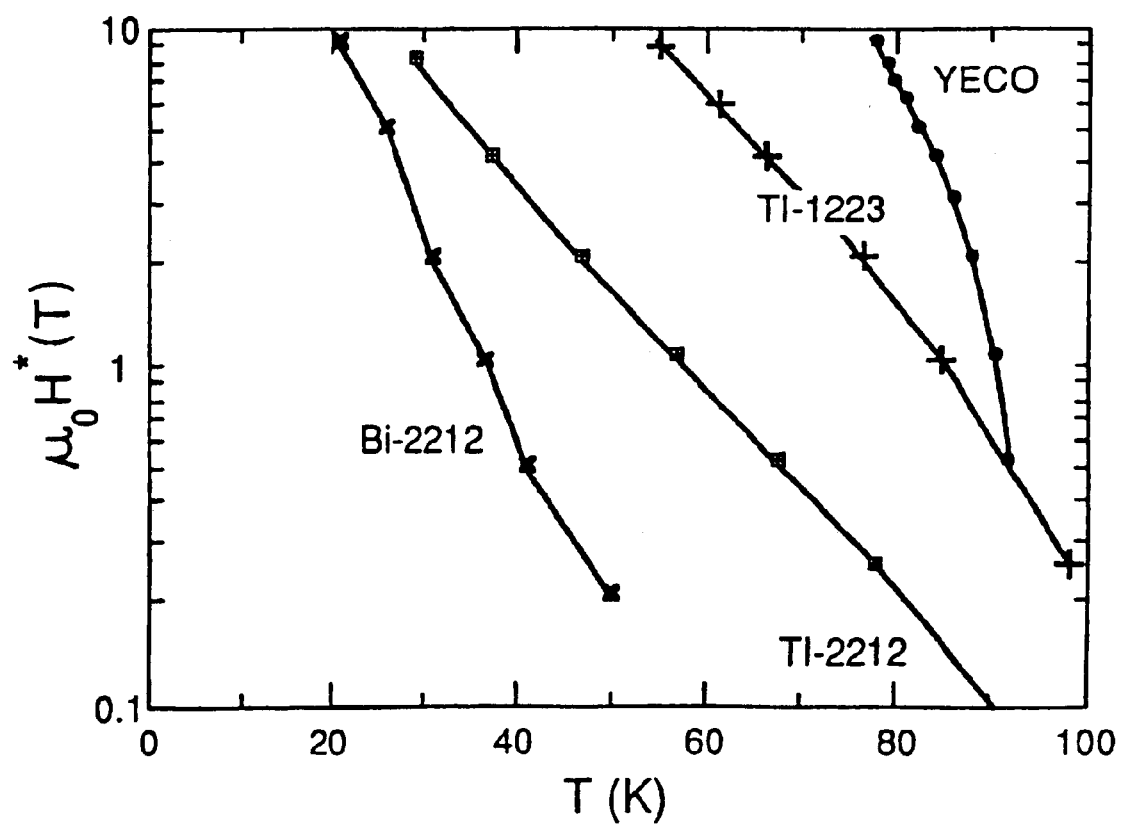
FIG. 2. Illustrates the irreversibility lines for the 2212 phase of the bismuth cuprate, the 2212 and 1223 phases of the thallium cuprate, and the 123 phase of the yttrium-barium-copper oxide families of high-$T_c$ superconducting ceramics.

Central to the technological application of these materials is the requirement to maintain the superconducting material in its superconductive state. Superconducting materials exhibit this phenomenon within well defined regions of temperature and magnetic field, which is related to fundamental intrinsic characteristics of the material. FIG. 2 shows the irreversibility line for distinct phases of various compositional families of high-$T_c$ superconducting ceramics. If temperatures and magnetic field intensities beyond those threshold values are applied to these superconductors, their superconducting state is irreversibly lost. In this instance the magnetic field must be completely removed and the superconductor must be allowed to cool again before superconductivity can once again be observed.

The density of electrical current passing through the superconductor can also cause the superconductor to revert back to its state of normal resistance if it attains a value beyond a critical threshold. The critical current densities which most superconductors can sustain are usually related to extrinsic characteristics of the materials, such as the way they were processed.

For superconductivity to be technological useful it must be embodied within an environment that allows it to sustain the superconducting state within physical parameters defined by its temperature, the electrical current density passing through it, and the intensity of an applied or self-generated magnetic field. If any region of the superconductor is exposed to temperatures, magnetic field or current densities beyond these critical thresholds, energetic disturbances will be generated within that region of the superconductor. These energetic disturbances are thermally dissipated in the superconductor, causing its local temperature to rise. If the heat generated by the disturbance is not drained quickly enough, the region will revert back to its state of normal resistance. Current passing through this normally resistive region will start to generate greater heat through resistive heating, which, if not quickly transported away from the superconductor can cause catastrophic failure along the entire length of superconductor.

The energetic disturbances that can trigger catastrophic failure have two root causes. They may originate from the release of mechanical energy that builds up as a result of electromagnetic forces acting upon mechanical components, or be the result of magnetic flux jumping within the superconductor.

A preferred embodiment of superconductors is to introduce them as filamentary components within a metal composite structure. The composition of the metallic matrices surrounding the superconductor is selected to have intrinsic properties, such as higher heat capacities and thermal conductivities than the superconductor, that allow heat generated within the superconductor to be quickly transported to a cooling reservoir without significantly increasing the temperature of the composite. The composite structure may also contain elements that act to improve the mechanical integrity of the composite under the effect of electromagnetic forces without compromising the ability to thermally process the superconductor.

Another means to improve the performance of the superconductor is by reducing flux jumping within it. That is achieved most directly through materials processing, either by improving the subdivision of the precursor materials used to form the superconductor, or by introducing microscopic flux pinning centers into the superconductor.

Figure 3:
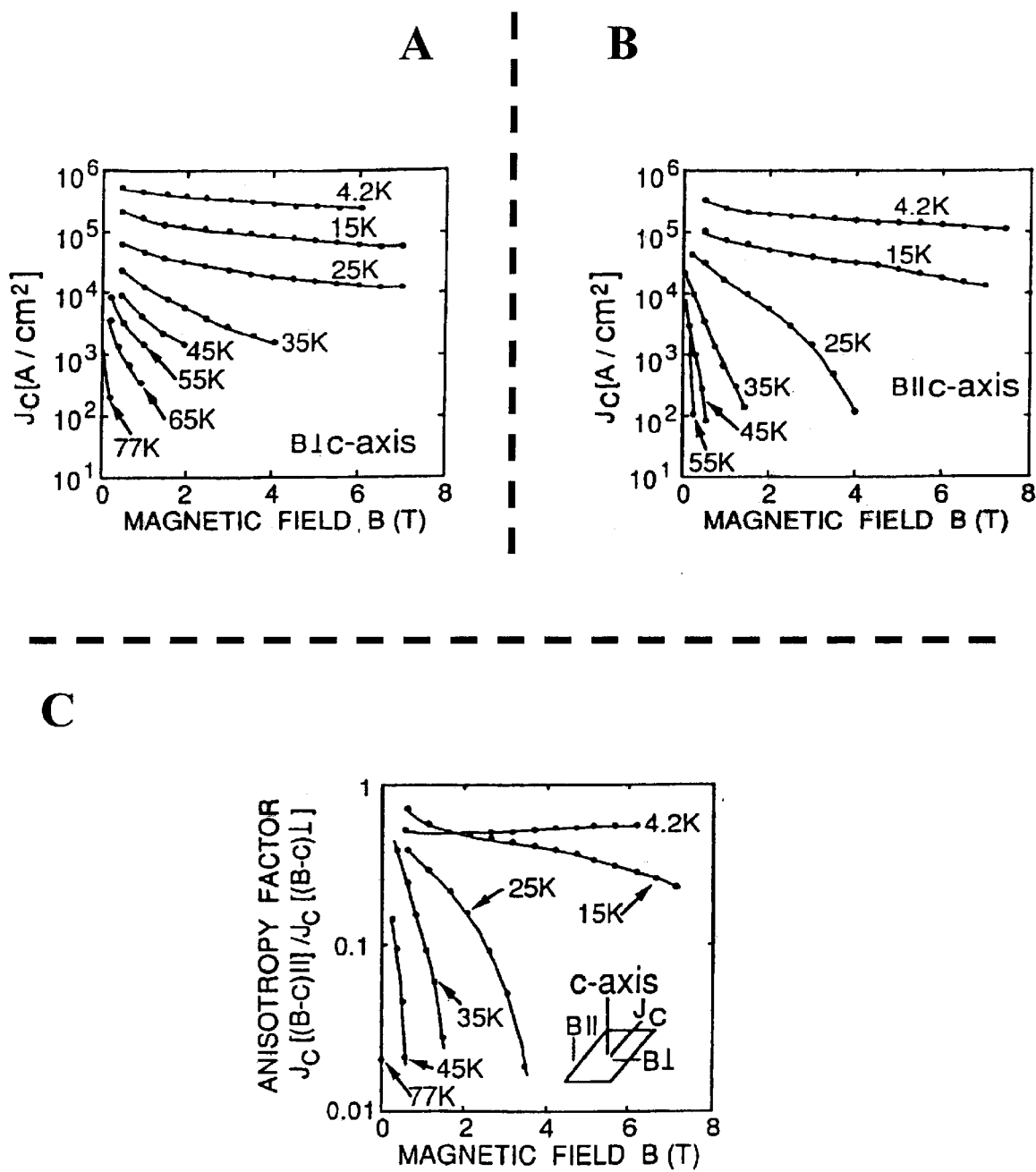
FIG. 3. Illustrates the crystallographic anisotropy in the 2223 bismuth cuprate high-$T_c$ superconducting is shown by measuring the critical current density in the material with magnetic fields applied perpendicular ($\perp$) and parallel ($\parallel$) to the crystallographic c-axis of the ceramic.

High-$T_c$ superconductors are not as successfully applied to conventional embodiments due to the crystallographic anisotropy in their superconducting properties. FIG. 3a,b,c, demonstrates crystallographic anisotropy in the 110 K phase of the bismuth cuprate compositional family. The superconductive state is more easily sustained if magnetic fields are oriented perpendicular to the c-axis of the ceramic. This state is much more easily ruptured by flux jumping when the field is oriented parallel to the ceramic c-axis, particularly at temperatures greater than 10–15 K.

Therefore, it is the preferred embodiment of this invention to construct composite structures from high-$T_c$ superconducting ceramics that have increased resistance to flux jumping energetic disturbances by orienting the c-axis of high-$T_c$ superconducting filamentary components in directions perpendicular to the magnetic field lines anticipated from the technological application.

Figure 4:
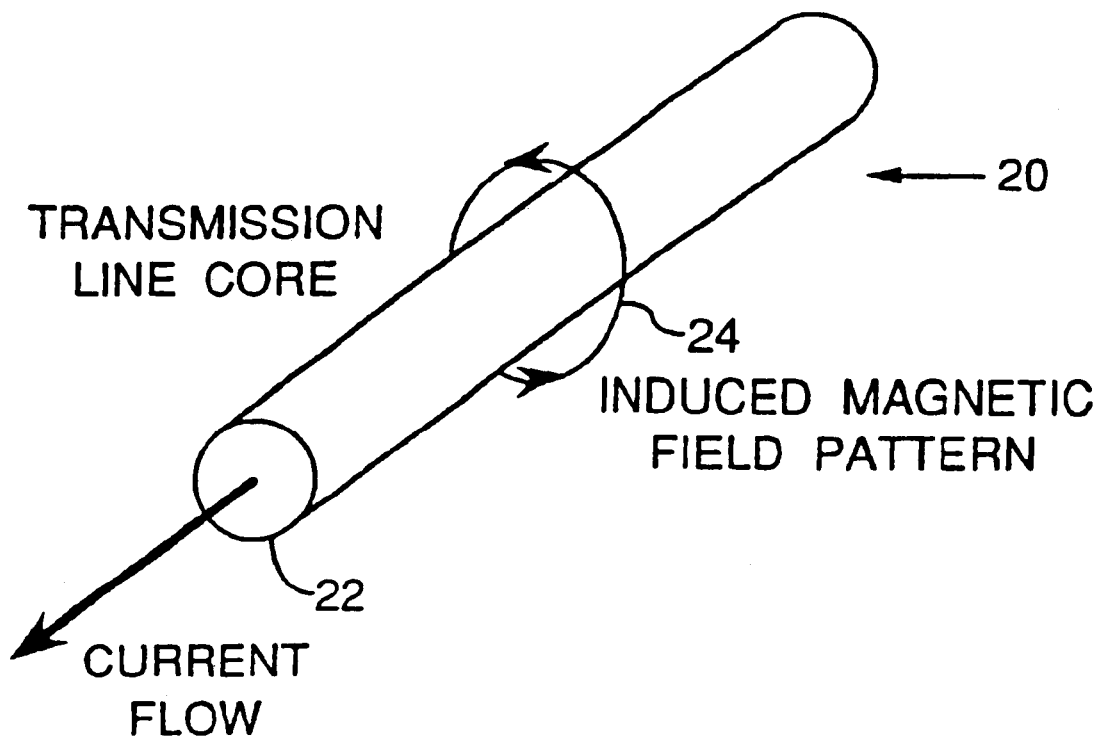
FIG. 4. Magnetic field pattern induced by current in a dc transmission line.
Figure 5:
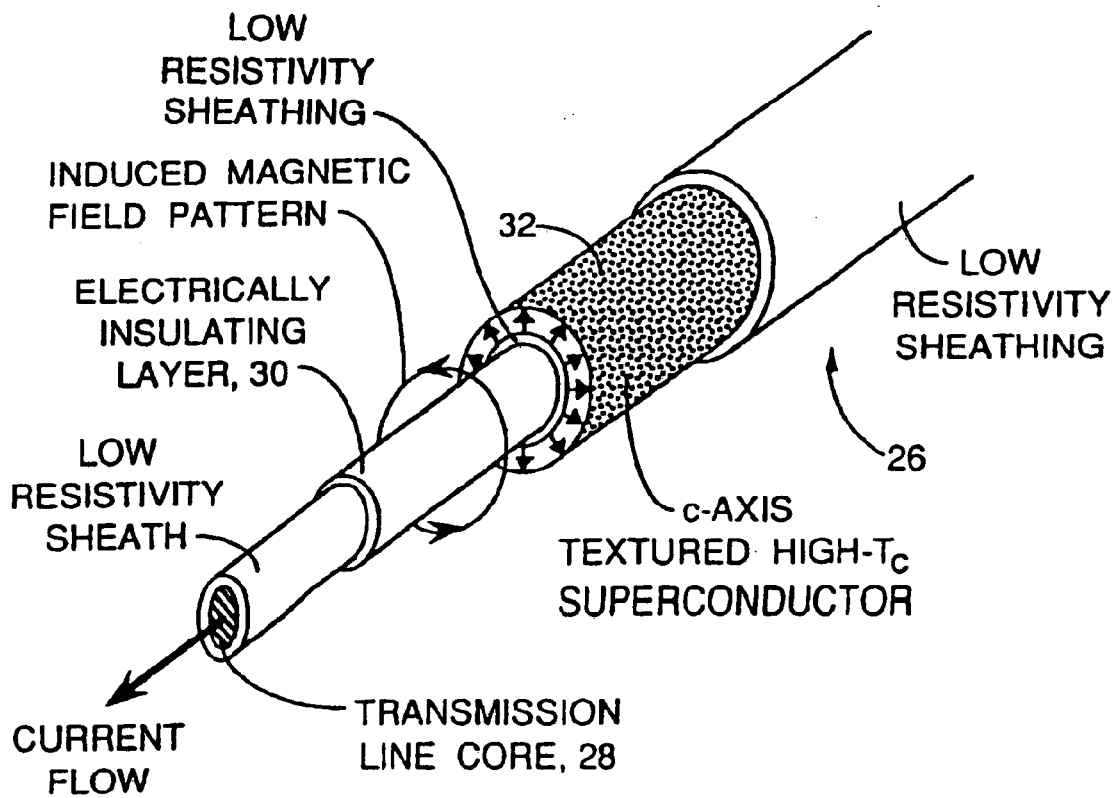
FIG. 5. Preferred embodiment of a transmission line with an HTSc ground plane.

FIG. 4 shows a transmission line 20 with a current passing through its core 22. The passing current induces a magnetic field 24 that is perpendicular to the direction of the current flow and loop around the wire 20. Given the orientation of magnetic fields induced by the direction of current flowing in the conductor, it is now possible to use this invention to construct a composite structure per FIG. 5, useful as a transmission line 26 containing a high-$T_c$ superconducting ground plane. Such a composite structure would have a superconducting transmission line core 28, surrounded by concentric filamentary components, at least one of which acts as an electrical insulator 30. An outer filamentary component 32 acts as the ground plane and contains high-$T_c$ superconducting ceramic with its c-axis oriented in the radial directions and perpendicular to the magnetic field lines generated by currents flowing in the core 28 of the transmission line 26. This structure is constructed by cutting a width of c-axis textured metal-superconducting-composite sheet 36, FIG. 13, to match the radial circumference of the transmission line and mechanically wrapping the sheet as a continuous cylindrical casing 34 around the transmission line 26. This method of construction orients the c-axis of the ceramic in the radial direction for the full 360° of arc about the longitudinal axis of the transmission line. The ground plane c-axis is, therefore, oriented tangentially to the fields generated by longitudinal currents in the transmission line core.

Figure 6:
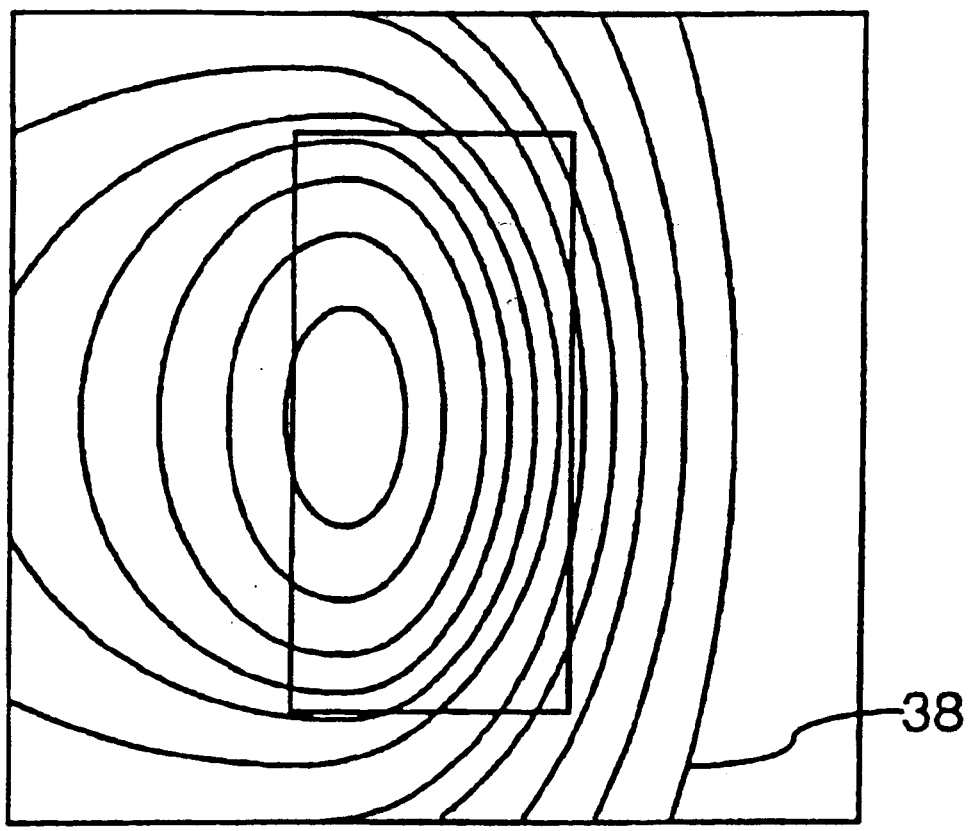
FIG. 6. Magnetic field pattern of a solenoid in the half plane.
Figure 7:
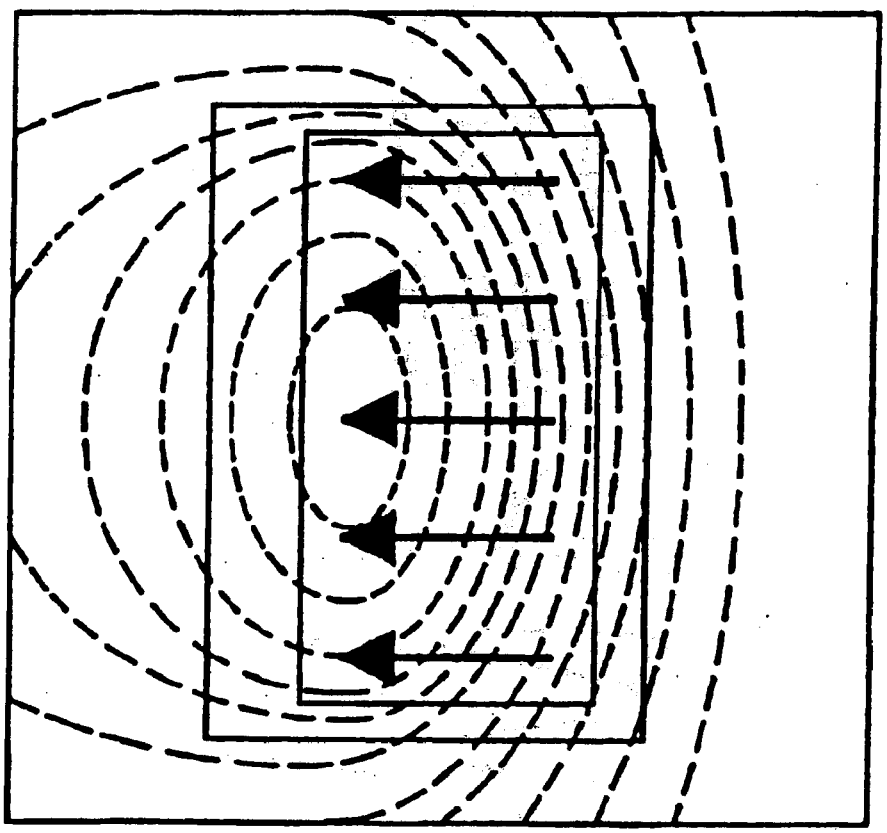
FIG. 7. Magnetic field pattern overlaying the c-axis orientation of a monocore HTSc ceramic solenoid in the half plane.

It is straight forward to demonstrate how this technique can be applied to composite structure deployed in more complicated field environments. FIG. 6 shows the lines of magnetic field 38 generated by a single solenoid loop in a cross-sectional half-plane of the solenoid. The field is generated by current running along the conductor with rectangular cross-sectional area, i.e., into the page in FIG. 6. As shown, the magnetic field pattern of this solenoid configuration can cause intense radial field components to be located within the conductor. If this solenoid were constructed from a billet-processed high-$T_c$ superconducting wire with a c-axis textured monocore, the composite would be extremely susceptible to energetic disturbances that would develop in those regions where the radial field components are oriented parallel to the c-axis of the ceramic FIG. 7. Unsuitable magnetic field orientations would cause these anisotropy components to tail except at temperatures where all the magnetic flux is expelled or the anisotropy is lifted.

Figure 8:
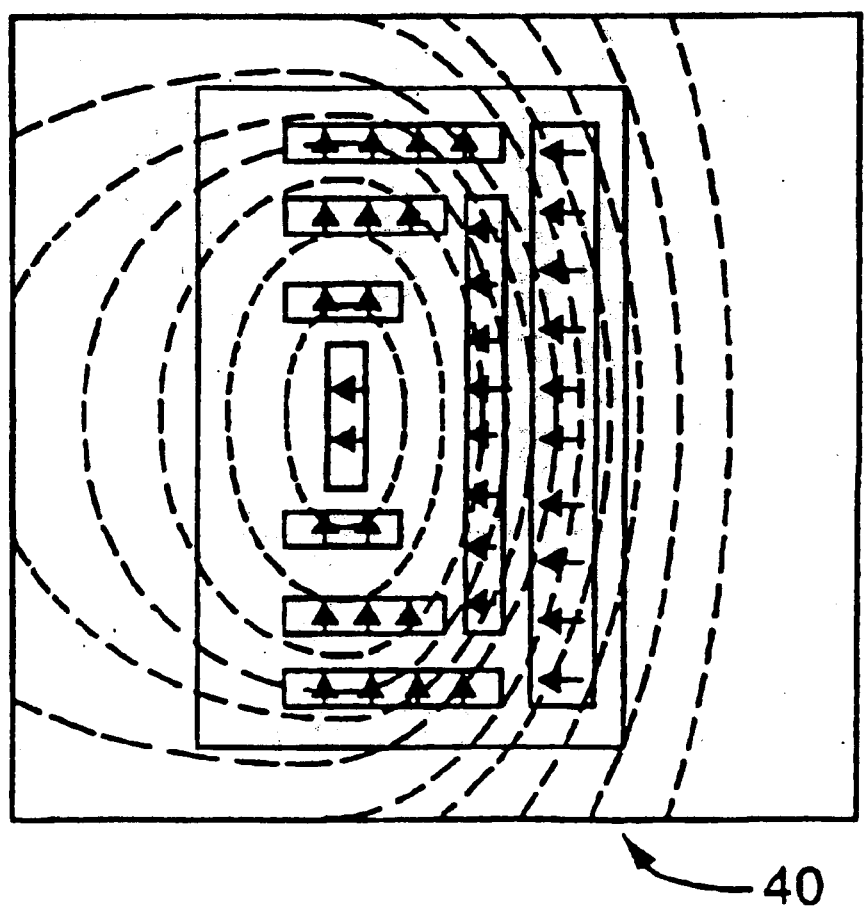
FIG. 8. Preferred embodiment of an HTSc solenoid with c-axis textured filaments oriented to be perpendicular to the magnetic field pattern.

Manufactured sheets of c-axis textured ceramic filament can be cut to specified width and assembled into a larger metal composite structure with other metallic or metal alloy filaments to construct a structure similar to that shown in FIG. 8. Composite structures 40 with c-axis textured high-$T_c$ superconducting filaments organized in patterns similar to that shown in FIG. 8 are useful because they provide superconducting current paths without significantly exposing the weak axis of the superconductor to the radial fields of the solenoid. A series of looped current paths are formed to generate the magnetic field but the composite structure will experience less flux jumping since the c-axes of the individual filaments have more favorable alignments with the magnetic field patterns. Designs similar to this can improve high-$T_c$ superconductor performance at temperatures above 15 K.

There are additional benefits to this process. It is unique as a wire or sheet manufacturing process because it rapidly achieves ultrafine subdivision of the individual precursors by mixing them as metalorganic acid salts in an organic acid solution. Prolonged grinding, milling, and reaction processing of precursor powders are not required in this process. Mixing the elemental components in solution allows them to achieve subdivision at the molecular level in a matter of minutes. This solution is then spray deposited onto a suitable hot metallic substrate. The heat supplied by the substrate causes the salts to pyrolyze into an oxide deposit at the substrate surface, forming the initial metal-ceramic precursor composite structure.

The use of spray deposition is unique because it preserves the ultrafine precursor subdivision better than any other solution application technique. Each of the dissolved precursor salts pyrolyze into an irreducible oxide form at different decomposition temperatures. When a dissolved salt decomposes into its oxide form it precipitates from the solution. Depending upon the rate at which the solution is heated, differences in the decomposition temperatures of the precursor salts can cause the microstructure of decomposed metal oxides to phase separate through their sequential decomposition. For instance, assume a solution is prepared to contain two salt precursors and one of the salts decomposes at a temperature of 265° C., while the other decomposes above 500° C. As the solution is heated from room temperature to a temperature above 500° C., the salt that pyrolyzes at 265° C. will decompose, precipitate from solution, and separate, at the molecular level, from the salt that decomposes at 500° C. When the solution reaches a temperature above the 500° C., the second salt will decompose, leaving a solution precipitate that is largely composed of two distinct microstructural phases.

Figure 9:
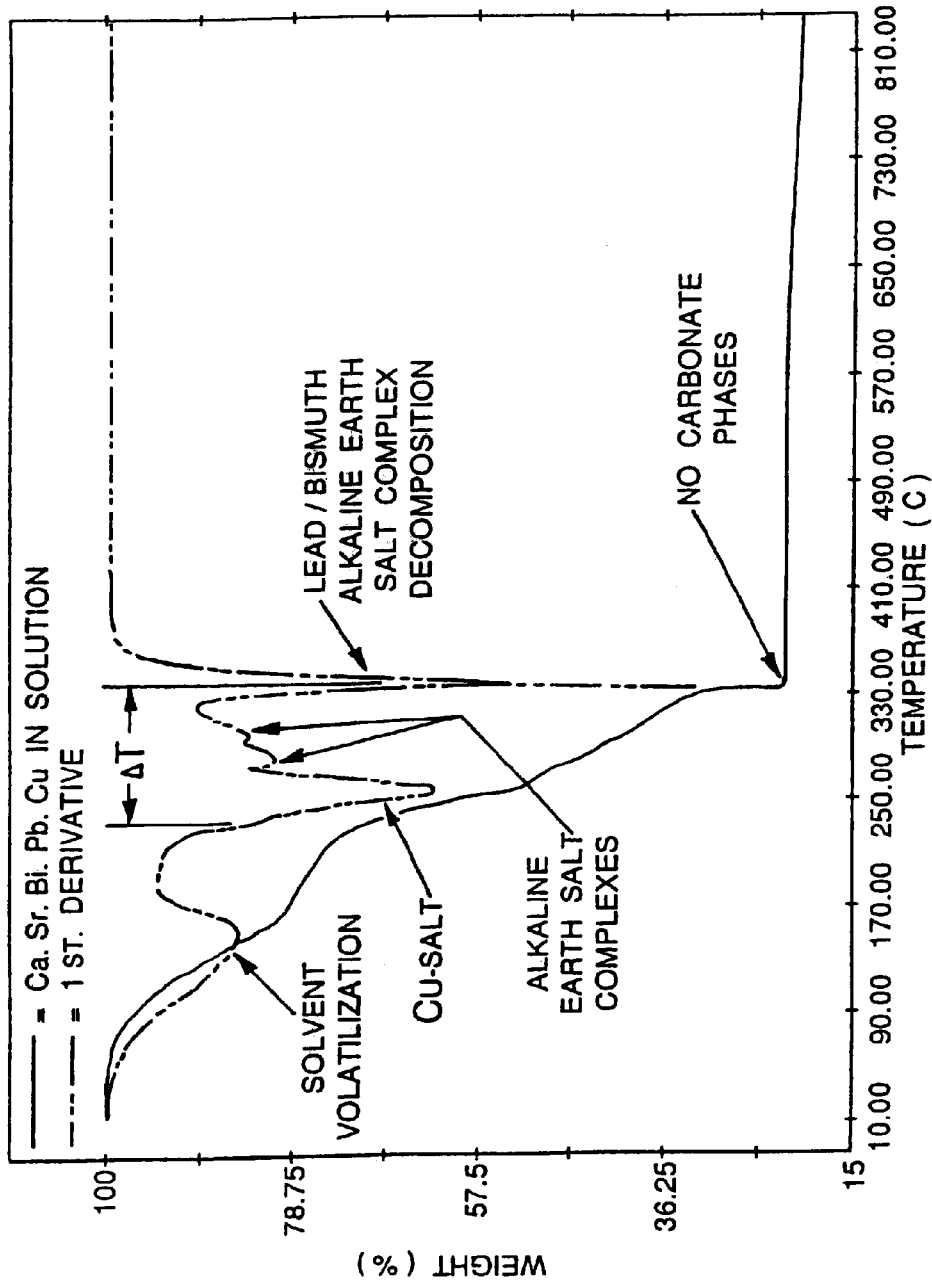
FIG. 9. Thermogravimetric analysis is used to show thermal decomposition spectra of carboxylic acid precursor salts in a solution used to manufacture bismuth cuprate HTSc ceramic.

Sequential decomposition can be reduced when processing ceramics from solution by engineering solutions that contain precursor salts that decompose over a very narrow temperature range, by polymerizing all the different metallic precursors into a molecular structure that decomposes at a single temperature, or heating the solution at a rate that is sufficiently rapid to achieve nearly simultaneous decomposition of all the salts. The synthesis of a precursor salt solution from a carboxylic acid-based chemistry allows all of the precursor salts to decompose over a fairly narrow temperature, and is one of the preferred embodiment of this invention. FIG. 9 uses a thermogravimetric trace to characterize the narrow ($\Delta T=100°$ C.) range of decomposition temperatures for carboxylic acid precursor salts useful in synthesizing high-$T_c$ superconducting ceramic in the Bi—Pb—Sr—Ca—Cu—O compositional family.

The use of an aerosol spray decomposition technique is a requisite and preferred embodiment of this invention because it achieves far greater rates of heating than can be achieved by applying the solution to the substrate by spin-coating or dip-coating techniques, and thus maintains the ultrafine precursor subdivision achieved in solution. Even if the precursor salt solution is engineered to have a narrow decomposition range, the rates of heating that can be achieved by simply placing a precursor film that was coated onto a room temperature substrate in a hot furnace is still not sufficient to prevent sequential decomposition and separation of the precursor oxide phases. An aerosol spray also causes all of the precursor salts to be contained within the volume of a droplet. Hence, if sequential decomposition does occur, precursor phase separation is constricted by the droplet size, allowing precursors to be subdivided at least within a physical proximity defined by the average droplet size.

The application of the precursor salts using an aerosol spray also allows composite structures of indefinite continuous length or surface area to be formed. Since this spray application technique can be preformed in an open chamber, there is no physical limitation to the surface dimension of metallic substrate that can be fed into the system input. Manufacture of extremely long continuous lengths can be achieved by winding the metallic substrate on to a payout spool and feeding it into the system off the spool. Once deposited, the composite structure can be collected onto a pick-up spool and stored for further processing.

The use of solutions prepared from carboxylic acid salts dissolved into an organic solvent is a requisite and preferred embodiment of this invention. This chemistry allows very high solution concentrations, up to ≅25% equivalent weight oxides, to be engineered. Contiguous ceramic deposits cannot be formed easily on metallic substrates via spray pyrolysis without this solution chemistry or high solution concentrations. Spray pyrolysis of HTSc ceramic precursors using chemistries other than the one defined causes a coating of loosely connected powder to form on the substrate that can be easily blown off its surface.

The method of solution preparation is also an embodiment of the invention. Carboxylic acids are organic compounds that contain the carboxyl group (—COOH)

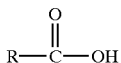

where R is either an alkyl or an aryl group. These acids are easily converted into non-volatile salts that can be held together in a crystalline solid by strong electrostatic forces. The temperatures that are required for melting the lattice of a carboxylic acid salt is so high, usually 300–400° C., that carbon-carbon bonds break and the molecule decomposes before the melting temperature is reached. This combination of low volatility and low-temperature pyrolysis within a relatively predictable range of decomposition temperatures makes these salts ideal for the spray decomposition of ceramic deposits.

These solutions can be prepared by mixing assayed proportions of salts in organic solution, or by sequentially reacting elemental precursor metals or acetate precursor salts with a carboxylic acid solution. Sequential reaction appears to reduce the formation of alkaline earth carbonate phases in sprayed deposits. Alkaline earth precursor metals are formed into salt precursors through the following reaction:

$$M°+2■RCOOH \rightarrow M^{2+}(OOCR)_2+H_2(g) \quad (2)$$

(M≡Ca, Sr, Ba),

All other metal precursor components can be formed into salts by introducing them to the carboxylic acid as acetate salts, then driving an exchange reaction and distilling off the acetic acid, i.e., $$M(OOCH_3)_X+X■RCOOH \rightarrow M^{X+}(OOCR)_X+H_3COOH. \quad (3)$$

The spray deposited ceramic formulation generally has a spongy, porous solid solution microstructure, which requires further processing before it can be brought into a physical condition that makes it useful to this invention. A finely subdivided, homogeneous blend of oxide precursors requires thermal processing in controlled atmospheres. The thermal processing can be broken down into two distinct procedural steps, calcination and sintering. The initial deposit is calcined to decompose any residual organic material that may not have decomposed during spray pyrolysis. As the oxide precursor deposit is heat treated, recognizable microstructural phases of the ceramic begin to nucleate and grow. Certain distributions of these microstructional phases favor or accelerate the conversion of the ceramic into a single high-$T_c$ superconducting phase during sintering. Failure to influence the proper microstructional phase distribution during calcination generally comprises the ceramic's superconducting properties after sintering. Therefore, a secondary objective of the calcination process is to transform the deposit from an oxide solid solution into a specific multiple phase ceramic. After calcination, the ceramic should have a microstructional phase chemistry that can be rapidly and reliably converted into the single desired HTSc phase during sintering.

This principle is most easily explained using the layered HTSc ceramics as an example. These compositional families are composed of oxides of one heavy-metal element—(bismuth and lead (Bi,Pb), thallium (Tl,) or mercury (Hg)), two alkaline earth components (calcium (Ca), strontium (Sr,) or barium (Ba)) and copper (Cu). The compositional families include (Bi, Pb)—Sr—Ca—Cu—O, Tl—Ba—Ca—Cu—O, and Hg—Ba—Ca—Cu—O. Each of these compositional families have similar crystalline phase chemistries. They have 20–30 K superconducting phases with 2201 phase chemistries, i.e., $(Bi,Pb)_2Sr_2Ca_0Cu_1O_6$, an intermediate temperature (75–95 K) superconducting phase designated as the 2212 phase, i.e., $(Bi,Pb)_2Sr_2Ca_1Cu_2O_8$, and a high-$T_c$ (>105 K) superconducting phase with 2223 phase chemistry, i.e., $(Bi,Pb)_2Sr_2Ca_2Cu_3O_{10}$. Each of these phase are similar, except a layer of $CaCuO_2$ has been intercalated into the crystalline structure of the progressively higher-$T_c$ phase.

The most effective reaction pathway to synthesize the 2223 phases during sintering is to react calcined microstructional phase distribution of 2212 ceramic with cuprous oxide (CuO) and calcium cuprate ($Ca_2CuO_3$) in the following strict proportions:

$$2212+0.5Ca_2CuO_3+0.5CuO \rightarrow 2223 \quad (4)$$

Typical conversion of the 2212+secondary phases in silver sheathed composites consists of an induction stage followed by the conversion reaction, which can best be described by a two-dimensional nucleation-growth mechanism. The 2223 phase adopts the c-axis orientation of the 2212 ceramic phase prior to the sinter reaction.

Figure 10:
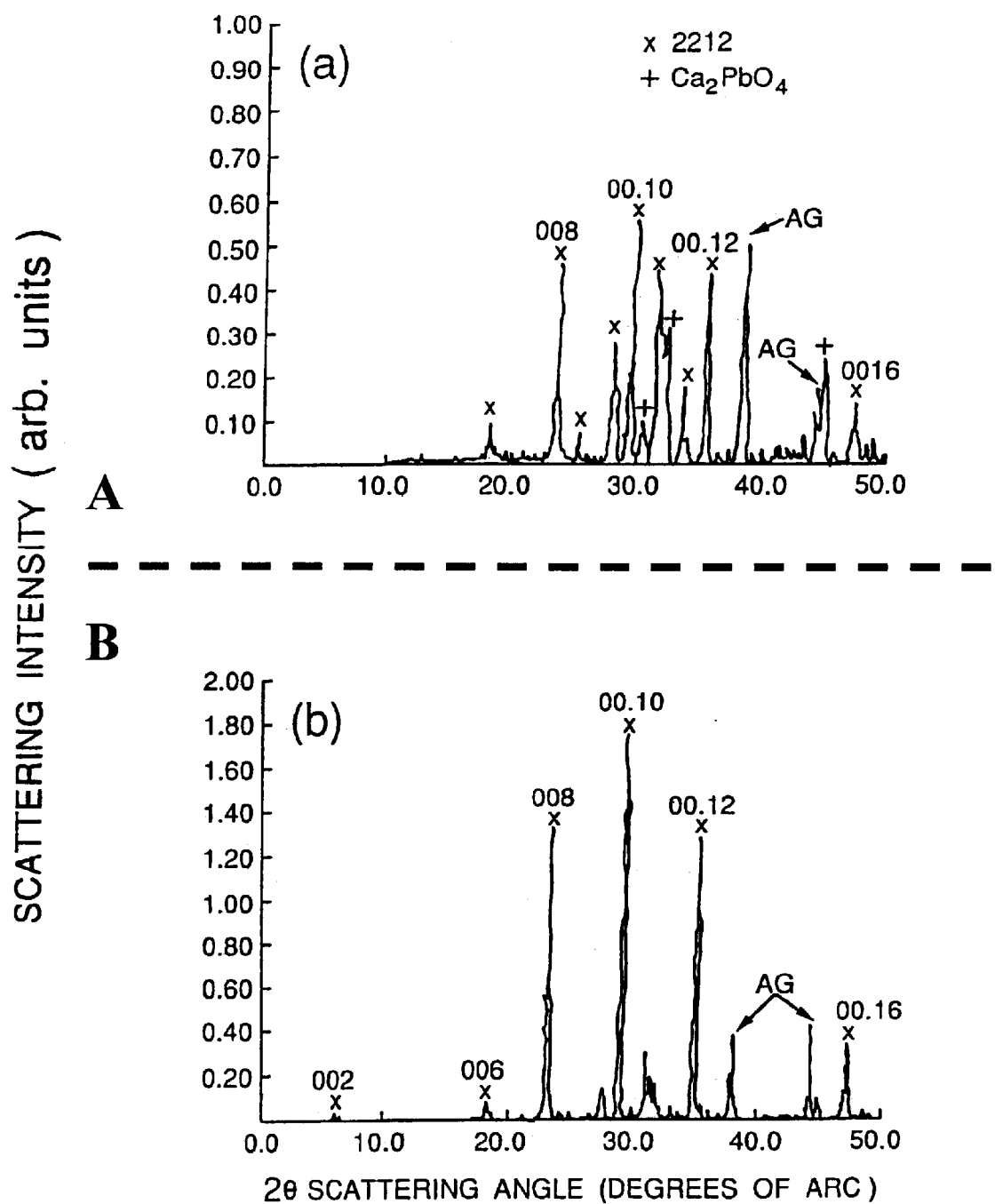
FIG. 10. XRD spectra displaying improvement in the ceramic c-axis texture in an Ag/Bi$_{1.68}$Pb$_{0.31}$Sr$_{2.20}$Ca$_{2.17}$Cu$_{3.06}$/Ag composite after (a) a 6 hour, 830° C. oxygen calcination treatment and one intervening mechanical cold press; and, (by a calcination treatment totaling 15 hours with two intervening mechanical cold presses.

It is therefore a preferred embodiment of this invention to thermomechanically calcine the sprayed deposit by interleaving heat-treatments with mechanical presses. This action has the effect of increasing the rate at which a sprayed deposit with 2223 stoichiometry is converted from an ultrafinely subdivided homogeneous solid solution of precursor oxides into 2212 ceramic+secondary phases. It further has the effect of texturing the 2212 phase in the ceramic with c-axis orientation predominantly along the vector mathematically describing the plane of the substrate, i.e., perpendicular to its surface. As shown in FIGS. 10A&B the repeated short heat treatments with intervening mechanical presses creates the c-axis textured metal-ceramic composite sheet structure that is central to the invention.

This stage of the process may be performed using a composite structure consisting of a single ceramic layer on metal with its surface exposed, or by pressing together two such structures, ceramic face-to-face, to form a sandwiched metal-ceramic-metal composite structure. The sandwiched structures would not be useful in applications that require an exposed superconducting surface, such as in a superconducting rf cavity resonator. However, these sandwich structures have enormous utility in the design and construction of high-$T_c$ superconducting metal composite structures, where it may be advantageous to the performance of the composite to have a metal other than silver in intimate contact with the superconductor.

Figure 11:
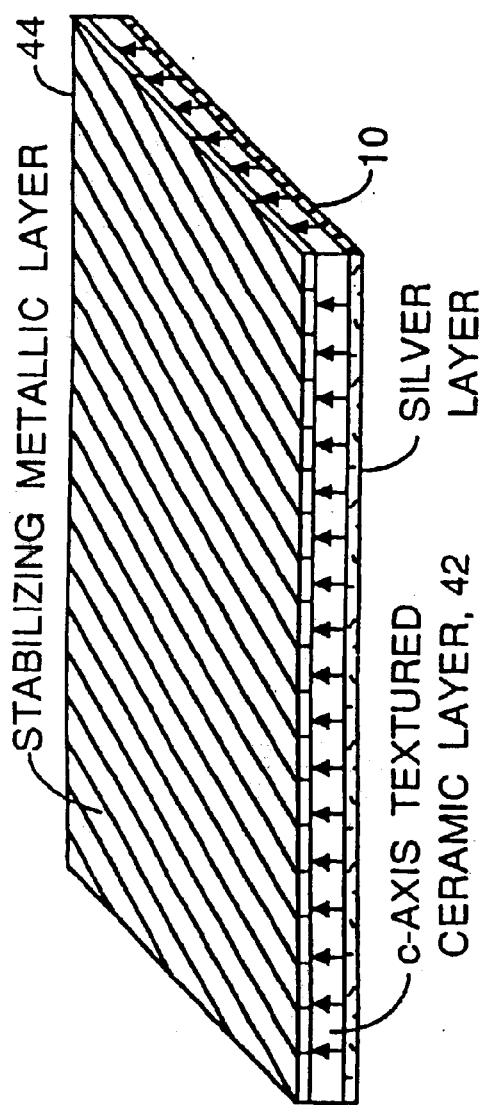
FIG. 11. A metal/ceramic/metal composite structure incorporating silver on one face and a stabilizing metal on the other face.

It is therefore a preferred embodiment of the invention to construct metal-ceramic-metal sheet structures, FIG. 1, in which the ceramic 14, between the metal layers 10 has its c-axis textured by thermomechanical calcination. It is, additionally, a preferred embodiment of the invention to construct these sheet structures by pressing together two different ceramic metal composite structures, one which has the ceramic 42 deposited on silver 10, or a metal 44 with comparable oxygen diffusivities at HTSc processing temperatures, to another, which has its ceramic deposited directly on a metal with intrinsic physical properties, such as a Young's modulus, heat capacity or thermal conductivity, that stabilizes the performance of the superconductor in the composite. (See FIG. 11). When structures such as this are embedded within a silver composite matrix, it is then possible to mechanically or thermally stabilize the ceramic filament with the metal on one of its sides, and still provide an oxygen diffusion pathway between the ceramic and the composite's exterior through the silver on the other side of the filament.

The transition temperatures of high-$T_c$ superconductors increase when a compressive force is applied to the ceramic. This allows higher thermodynamic loads, currents and magnetic field intensities, to be applied to these ceramics when they are in a state of compression. This invention can be used to manufacture composite structures using ceramics with magnetostrictive properties. Magnetostrictive materials change their crystallographic dimensions when magnetized. The amount of dimensional change observed is a function of the ceramic composition, the applied magnetic field strength and its relative orientation to the crystallographic c-axis of the ceramic. Some materials are magnetostrictive along the c-axis, while others exhibit this property in the a-b plane. As they expand (or contract) in one crystallographic orientation, they contract (or expand) in the perpendicular plane. Composites containing c-axis textured filaments with these properties can be used to apply compressive loads to superconducting filaments, if suitably configured. Therefore an embodiment of this invention includes its use to manufacture ceramic filamentary sheets that can directionally alter compressive stresses on components in a larger composite structure in a manner that is proportional to the applied or generated magnetic field intensity.

Figure 12:
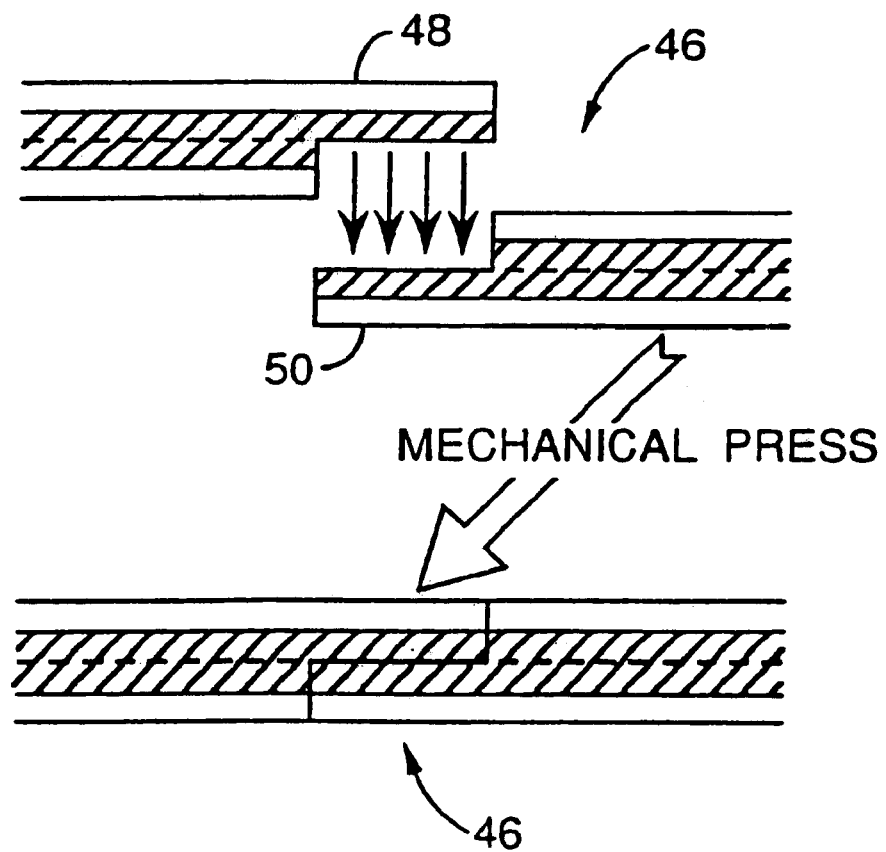
FIG. 12. Spliced joint in a metal/ceramic/metal composite structure.

Another embodiment of this invention, FIG. 12, allows smaller composite sheet structures to be spliced into larger sheets without disrupting the continuity of the superconducting layer, or to use a splice joint 46 to form a closed ceramic or superconducting surface topology from a single-sheet of composite. Spliced joints with a continuously interconnected superconducting layer are easily formed using the sandwiched metal/ceramic/metal composite structures. This is achieved by allowing one of the metal-ceramic sheets pressed into the sandwich to have an edge 48 that hangs over the side of the other. This overhanging edge can be mated with an underhanging edge 50 from another sandwich structure and mechanically pressed together.

Figure 13:
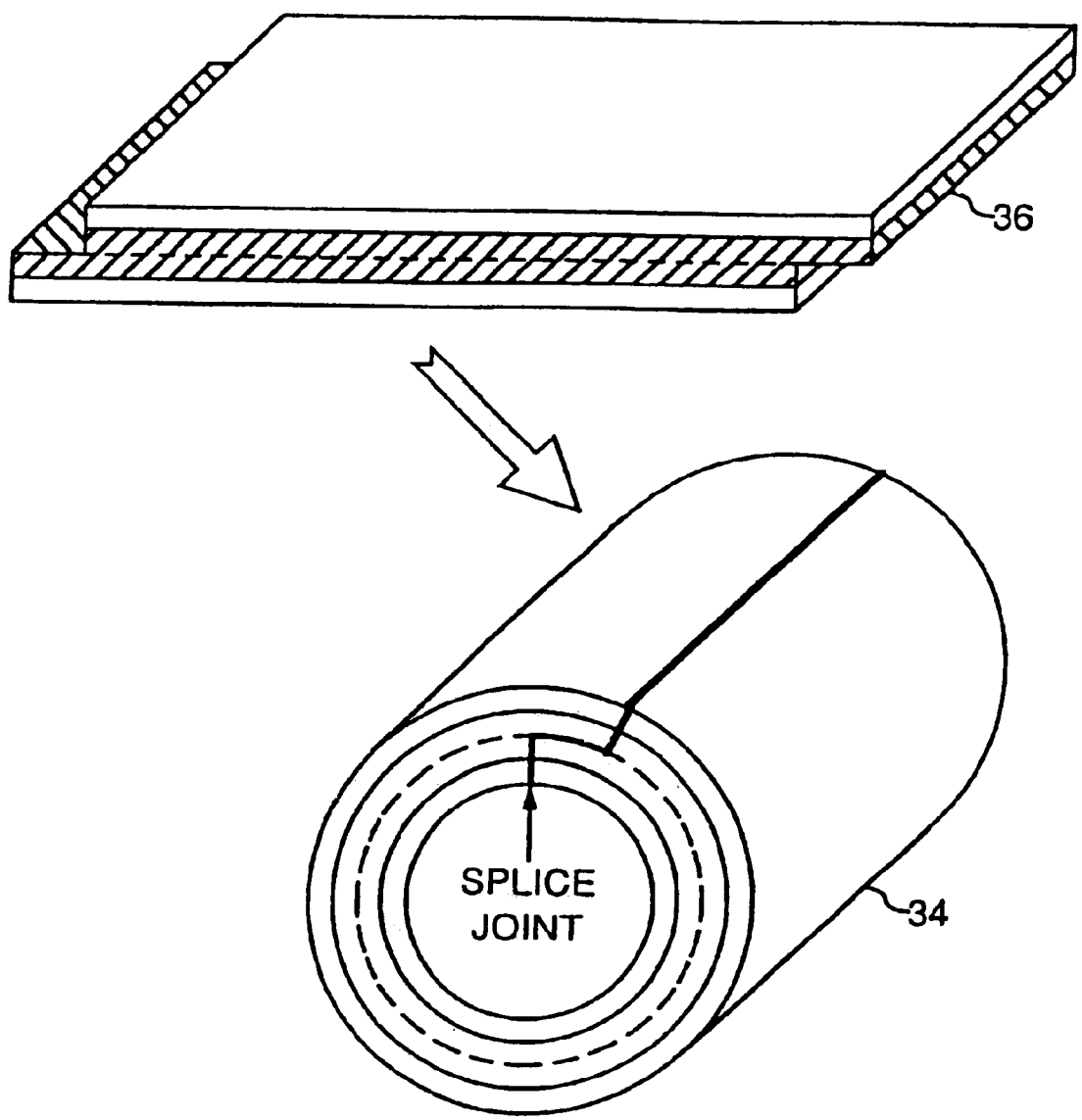
FIG. 13. Utilizing splice joint technology to form a closed topological surface from a single composite sheet.

FIG. 13 shows how a continuous closed ceramic topological surface, in this case a cylinder 34, can be constructed from a single composite sheet. The sheet sandwich structure is constructed using two ceramic-metal composite sheets of equal surface dimensions. The top sheet is laterally displaced from the bottom sheet along one direction, causing it to overhang on one side and to underhang on the other. The sheets are mechanically pressed and wrapped into a cylinder where the overhanging edge mates with the underhanging edge. An additional press along the seam closes the ceramic loop.

Sintering high-$T_c$ superconducting ceramics from a homogeneous distribution of microstructural phases into a pure single phase with the highest-$T_c$ requires the use of controlled oxygen atmospheres, which can simultaneously decompose the (thermomechanically) calcined ceramic if it is not hermetically sealed in a silver sheath. Silver allows the oxygen atmosphere exterior to the composite to regulate the conversion reaction (equation (4)) and prevents loss of the more volatile components of ceramic. A principal advantage to this invention is that these c-axis textured ceramic sheets can be cut to specified dimension and assembled into a larger composite structure as filaments and have the same c-axis orientation in the assembly after sintering. This is not possible using billet processing techniques in which the calcined powders are packed into a tube with random c-axis orientations prior to sintering.

Figure 14:
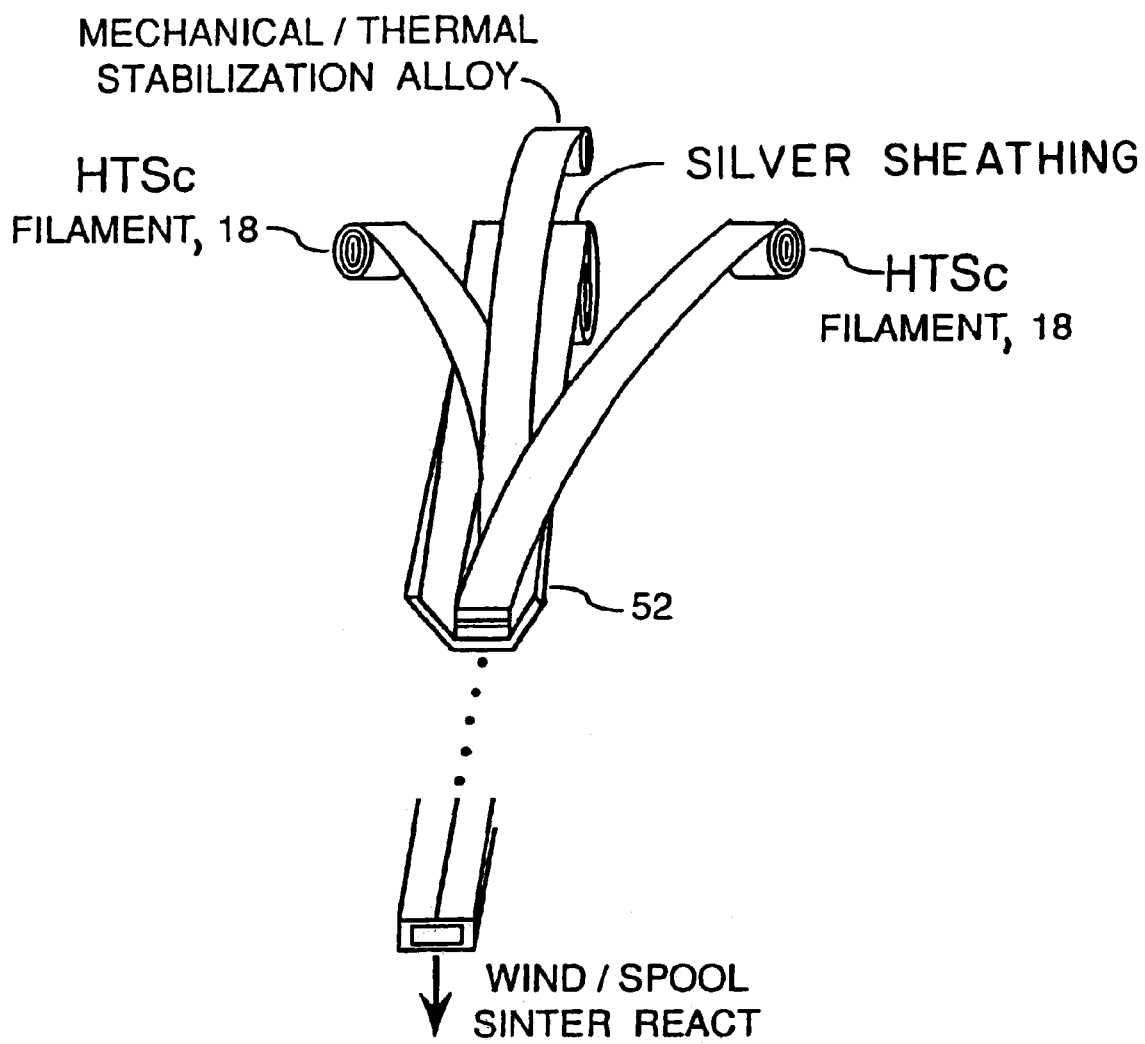
FIG. 14. Assembling metal ceramic composite sheets into a larger and more complex composite structure.
Figure 15:
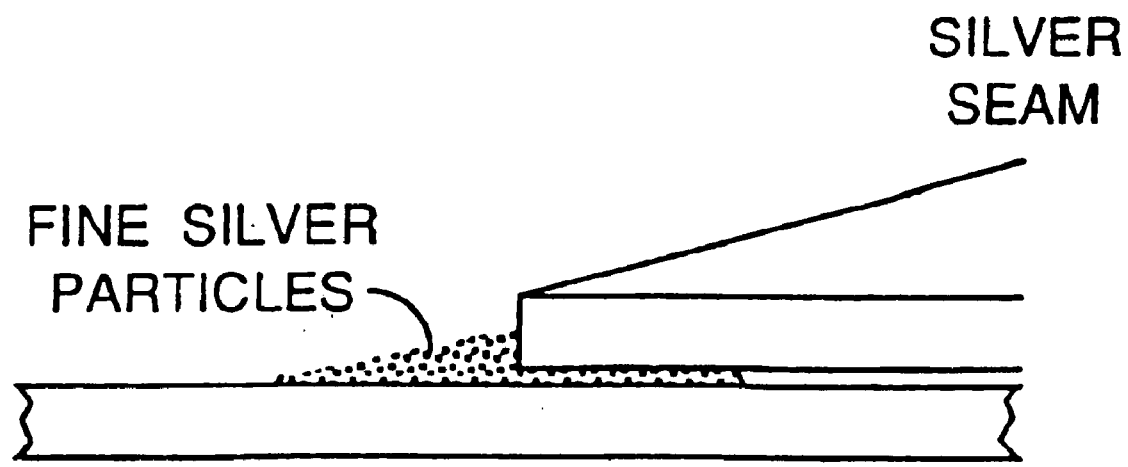
FIG. 15. Use of fine Ag particles to form a hermetic seal at a silver-silver interface.

A method for embedding c-axis textured sheets into a larger silver composite, FIG. 14 uses a sheet of silver sheathing and mechanically deforms it into well shaped structure 52. The c-axis textured sheets can then be mechanically shaped (if necessary) and inserted into the well with other metal or ceramic filamentary components (if desired). The planar orientation of the sheet placed in the well determines the c-axis orientation of the filamentary component. Metallic or ceramic composite spacer filaments can be added to the composite to adjust relative filament spacing(s) to conform to the design intended for the composite. Side walls to the well can be then folded over the assembly and close the composite at a silver-silver seam (See FIG. 14). This process step is compatible with the manufacture of continuous composites of indefinite length since each of the filaments can be drawn from a payout spool and be spliced into longer lengths before being placed in the silver casing (See FIG. 15). Fine silver particles arc preferred since other metallic particles could form an alloy with the silver sheathing that has a eutectic melting point at temperatures required to sinter the ceramic embedded within the composite.

However, when the sheathing is a silver alloy described below, the powder can be of silver or silver alloy and preferably both are of the same alloy.

These fine particles can be applied to the surfaces of the sheathing material using a silver loaded epoxy, paste; slurry, or electroless plating compound. They can be adhered to the surface of the silver by either curing and firing the epoxy or paste, or by drying the slurry. The surface activity of these fine silver particles is enhanced by their small dimension. Once the seam has been mechanically pressed, these fine particles can be fused by heating to hermetically seal the seam.

That is, silver particles were of interest. However, the melting point of silver is 960° C., a temperature that would be damaging to the filament components. However, it was unexpectedly found that silver powder could be fused well below such temperature to thus fuse the surfaces of the silver sheathing together in a temperature range of 550 to 750° C. with no apparent damage to the filament components within, i.e., no loss of volatiles from the ceramic filament was detected.

The sheathing can be made of various metals such as silver and alloys thereof, including Ag—Cu, Ag—Pd, Ag—Au, Ag—Pt, and Ag—Ti.

As indicated above, the fusing temperature of (metal) sheet-powder-sheet of the invention is preferably below the melting point of the metal components being fused.

Also such fusing temperature is preferably sufficiently low so as not to prematurely sinter the ceramic contents before the sheath is sealed, to avoid escape of volatiles from the ceramic and degradation of its potential superconductor (sc) properties.

Accordingly, per the invention, the fusing of sheet-powder-sheet into a sheath takes place preferably below the melting point of the metal and such components and also below the sintering temperature of the ceramic contents of such sheath.

In the above silver sheath example, a suitable ceramic sintering temperature was in the range of 770–850° C.

Also sealed sheaths of Ag or alloys thereof, can admit $O_2$ through the walls thereof while blocking other gases such as $N_2$ as well as preventing the escape of volatiles of the above ceramic contents. Thus in the above example, the ceramic sintering temperature can vary, e.g., per the following table.

TABLE I

| Sintering Atmosphere satm | Sintering Temperature |
|---|---|
| where % = mole % | |
| 100% $O_2$ | 835–850° C. |
| 10% $O_2$/90% argon | about 810° C. |
| 0.1% $O_2$ | about 790° C. |
| 0.01% $O_2$ | about 770° C. |

Thus as indicated above per the method of the present invention, a metal sheet is wrapped around a ceramic filament of the invention with the overlapping layers arranged in a metal sheet-powder-sheet sandwich which is pressed into contact and then fused at a relatively low temperature. That is, a temperature below the melting point of such metal components and desirably below the sintering temperature of the ceramic filament within the resulting sheath. Then sintering heat is applied to the so enclosed ceramic filament (to, e.g., partly liquefy same which can intercalate with a remaining portion of such filament) without damage to the sheath seal and without escape of volatiles from the so heated ceramic filament, which upon cooling can crystallize into a superconductor.

That is, escape of volatiles before or during during sintering can cause the so sintered filament (end product) to be non-superconducting, hence the advantage of the present invention.

Further, the heat of sintering can be above the fusing temperature of the sheath layers without damage to the resulting seal as long as such sintering temperature is below the melting point of the metal of the seal components, to avoid breaking the sheath seal with likely loss of ceramic volatiles, as discussed above.

What is claimed is:

1. A method for enclosing at least one superconducting (sc) ceramic filament comprising,
   a) placing at least one filament on a sheet of metal,
   b) wrapping said sheet about said filament to form a sheath therefor having closely spaced or overlapping surfaces,
   c) applying powder of at least one metal between said surfaces,
   d) pressing said surfaces and said powder into contact and
   e) applying sufficient heat to fuse said powder and said surfaces together to seal said sheath, which heat is below the normal melting point of the metal in said powder and surfaces.

2. The method of claim 1 wherein the applied heat of step e) is also below the sintering temperature range of said filament.

3. The method of claim 1 wherein the metal sheet and powder are of the same metal.

4. The method of claim 1 wherein said metal sheet and said powder are selected from the group of silver and silver alloy.

5. The method of claim 4 wherein the metal sheet is of silver or silver alloy selected from the group of Ag—Cu, Ag—Pd, Ag—Au, Ag—Pt and Ag—Ti.

6. The method of claim 5 wherein said powder is of silver and said sheet is of silver.

7. The method of claim 1 wherein said surfaces and powder are pressed together to form a seam and said seam is heated sufficiently to bond same, but at a temperature below the melting point of the metal forming said surfaces and powder and below the sintering temperature of said ceramic filament.

8. The method of claim 7 wherein the so enclosed and sealed ceramic filament is sintered and crystallized into a superconductor within said sheath.

9. The method of claim 4 wherein said metal surfaces and said powder are of silver and are heated to a temperature range of 550–750° C. to fuse said powder and surfaces together and sintering said ceramic filament within the sealed sheath in range between about 770–835° C.

10. The method of claim 1 wherein abutting metal surfaces having said powder therebetween are pressed together and then heated to fuse same.

11. The method of claim 1 wherein overlapping metal surfaces having said powder therebetween are pressed together and then heated to fuse same.

12. The method of claim 1 wherein said ceramic filament is hermetically sealed in said sheath without loss of ceramic components.

13. The method of claim 12 wherein said ceramic filament is sintered within said sheath to liquefy the former into one phase without evaporative or liquid loss of ceramic components and cooling said filament to a crystalline phase to form a superconductor.

* * * * *